United States Patent [19]

Ochi et al.

[11] Patent Number: 5,117,131
[45] Date of Patent: May 26, 1992

[54] BUFFER CIRCUIT HAVING A VOLTAGE DROP MEANS FOR THE PURPOSE OF REDUCING PEAK CURRENT AND THROUGH-CURRENT

[75] Inventors: Shinji Ochi; Yasunori Tanaka, both of Yokohama, Japan

[73] Assignee: Kabushiki Kaisha Toshiba, Kawasaki, Japan

[21] Appl. No.: 742,551

[22] Filed: Aug. 9, 1991

Related U.S. Application Data

[63] Continuation of Ser. No. 540,334, Jun. 19, 1990, abandoned.

[30] Foreign Application Priority Data

Jun. 30, 1990 [JP] Japan ................... 1-169385

[51] Int. Cl.$^5$ ........................................ H03K 19/092
[52] U.S. Cl. ................... 307/448; 307/451; 307/460; 307/475; 307/443
[58] Field of Search ............ 307/448, 451, 460, 475, 307/443

[56] References Cited

U.S. PATENT DOCUMENTS

| 4,469,959 | 9/1984 | Luke et al. . | |
| 4,518,875 | 5/1985 | Aytac | 307/451 |
| 4,558,234 | 12/1985 | Suzuki et al. | 307/451 |
| 4,584,491 | 4/1986 | Ulmer | 307/451 |
| 4,763,022 | 8/1988 | Sheldon . | |
| 4,783,603 | 11/1988 | Goforth et al. . | |
| 4,791,321 | 12/1988 | Tanaka et al. | 307/475 |
| 4,806,801 | 2/1989 | Argade et al. . | |

FOREIGN PATENT DOCUMENTS

| 0223267 | 5/1987 | European Pat. Off. . | |
| 0251383 | 1/1988 | European Pat. Off. . | |
| 0136418 | 7/1985 | Japan | 307/451 |
| 0256224 | 12/1985 | Japan | 307/448 |
| 0132527 | 6/1988 | Japan | 307/448 |
| 0181225 | 7/1989 | Japan | 307/448 |
| 2130833 A | 6/1984 | United Kingdom . | |

OTHER PUBLICATIONS

Japanese Patent Abstract Publication E-581, Vol. 12, No. 44, p. 2821, Feb. 9, 1988, for Japanese Patent Document No. 62-194732.
Japanese Patent Abstract Publication E-411, Vol. 10, No. 168, p. 2224, Jun. 14, 1986 for Japanese Patent Document No. 61-19227.
Japanese Patent Abstract Publication E-556, Vol. 11, No. 346, p. 2793, Nov. 12, 1987 for Japanese Patent Document No. 62-125713.
Japanese Patent Abstract Publication E-361, Vol. 9, No. 298, p. 2021, Nov. 26, 1985 for Japanese Patent Document No. 60-136418.
Japanese Patent Abstract Publication P-270, Vol. 8, No. 89, p. 1526, Apr. 24, 1984 for Japanese Patent Document No. 59-3787.
Japanese Patent Abstract Publication E-176, Vol. 7, No. 115, p. 1260, May 19, 1983 for Japanese Patent Document No. 58-34956.
Electronic Components & Applications, Vol. 7, 1986, No. 3, "Using 74HCT HCMOS to Replace LSTTL and Drive Transmission Lines", by Rob Volgers.

Primary Examiner—Stanley D. Miller
Assistant Examiner—Scott A. Ouellette
Attorney, Agent, or Firm—Finnegan, Henderson, Farabow, Garrett, and Dunner

[57] ABSTRACT

A buffer circuit comprising a first power terminal, second power terminal, a complementary first FET pair arranged between the first and second power temrinals to receive an external signal, a complementary second FET pair which is arranged between the first and second power terminals and whose input terminal is connected to an output terminal of the first FET pair, and voltage drop means arranged between the first power terminal and the first FET pair.

20 Claims, 8 Drawing Sheets

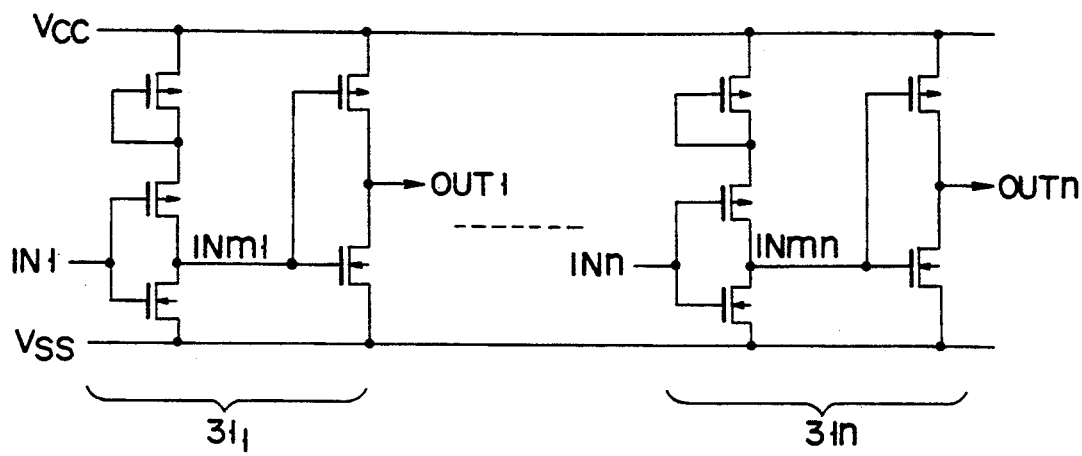
F I G. 3
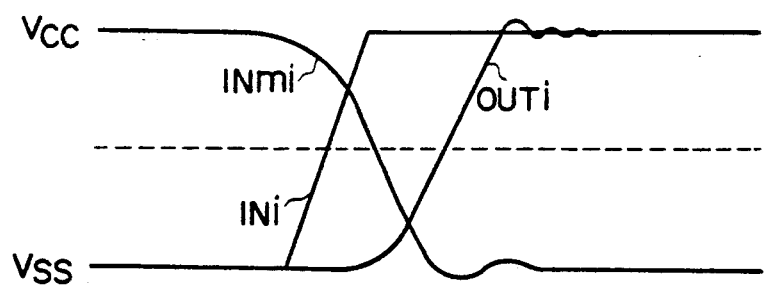
F I G. 4

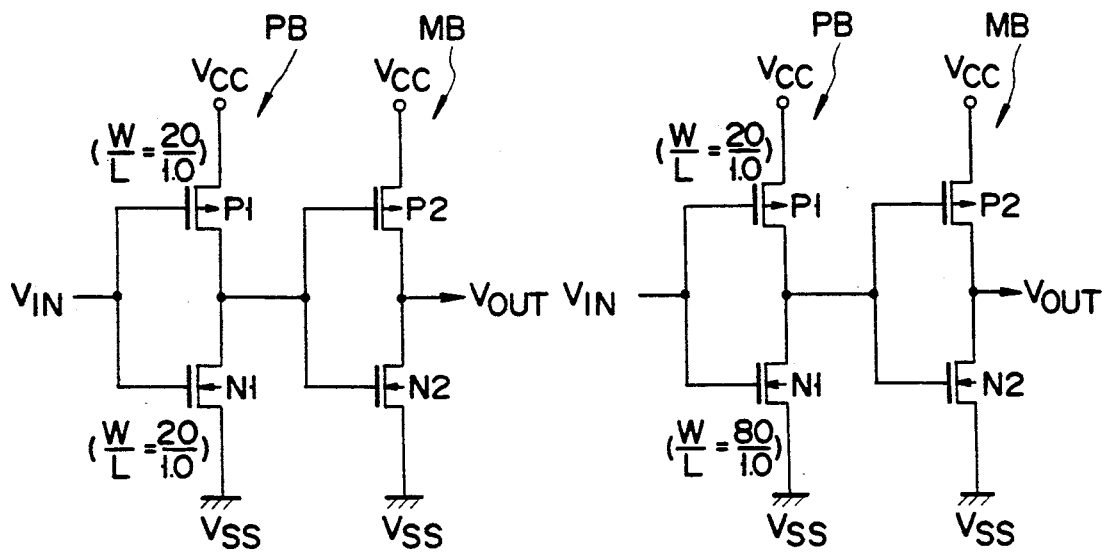
F I G. 5 PRIOR ART
F I G. 6 PRIOR ART
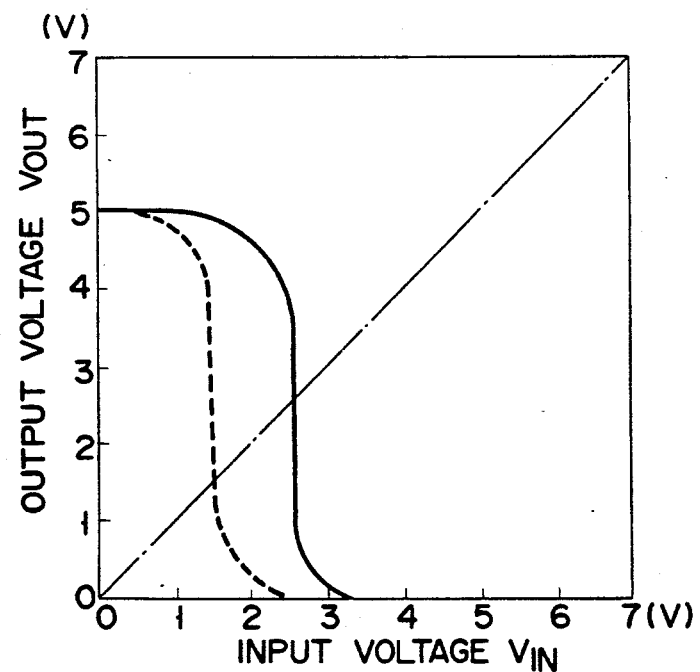
F I G. 7 PRIOR ART

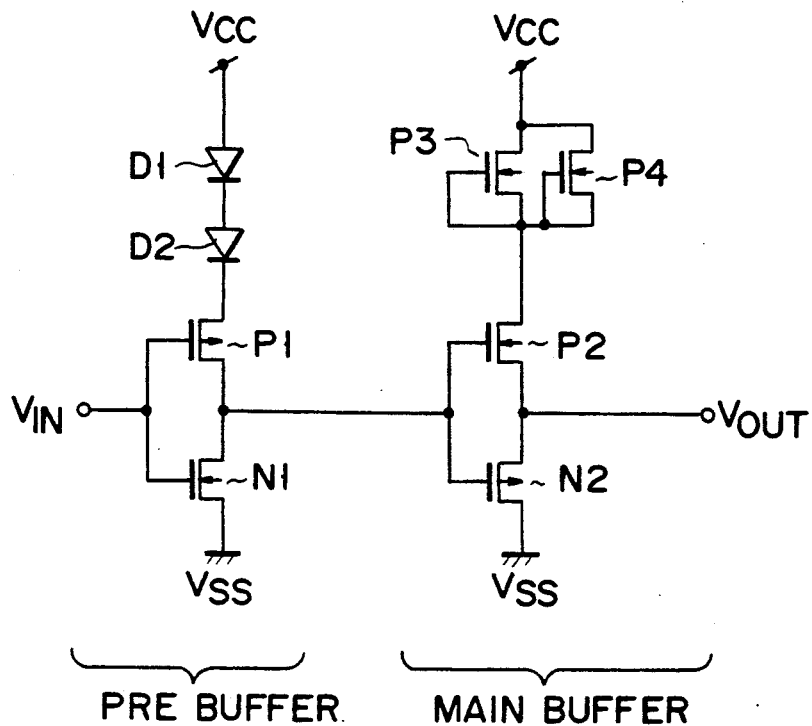
F I G. 12
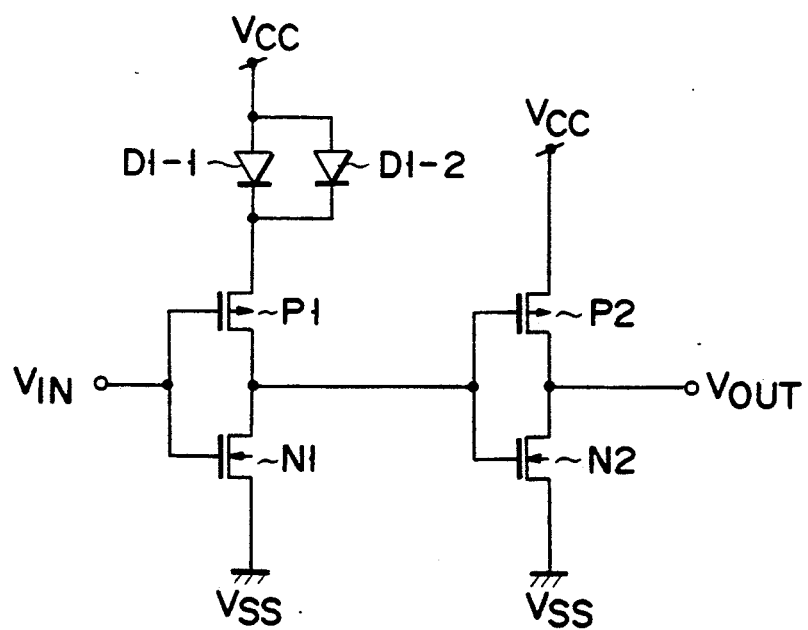
F I G. 13

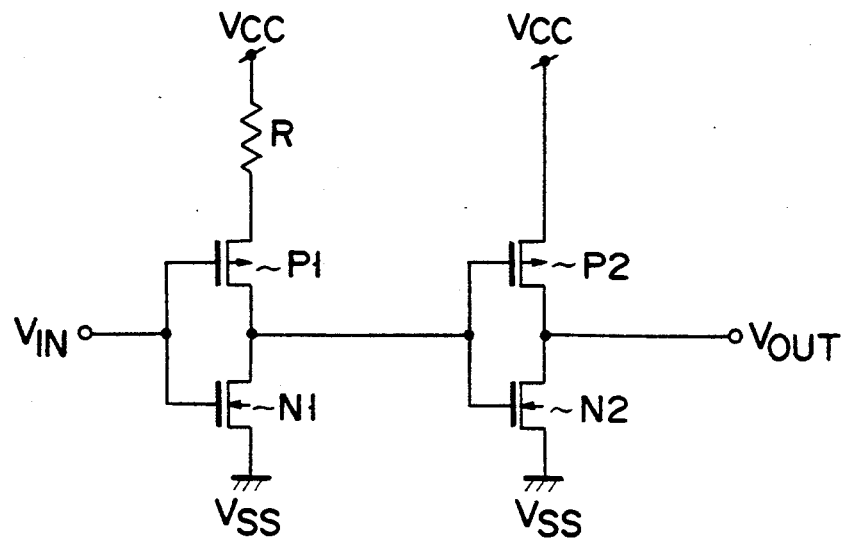
F I G. 14
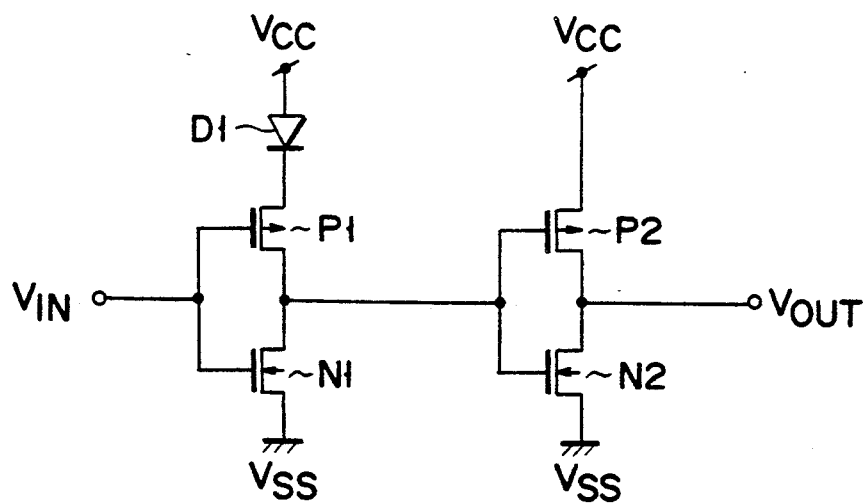
F I G. 15

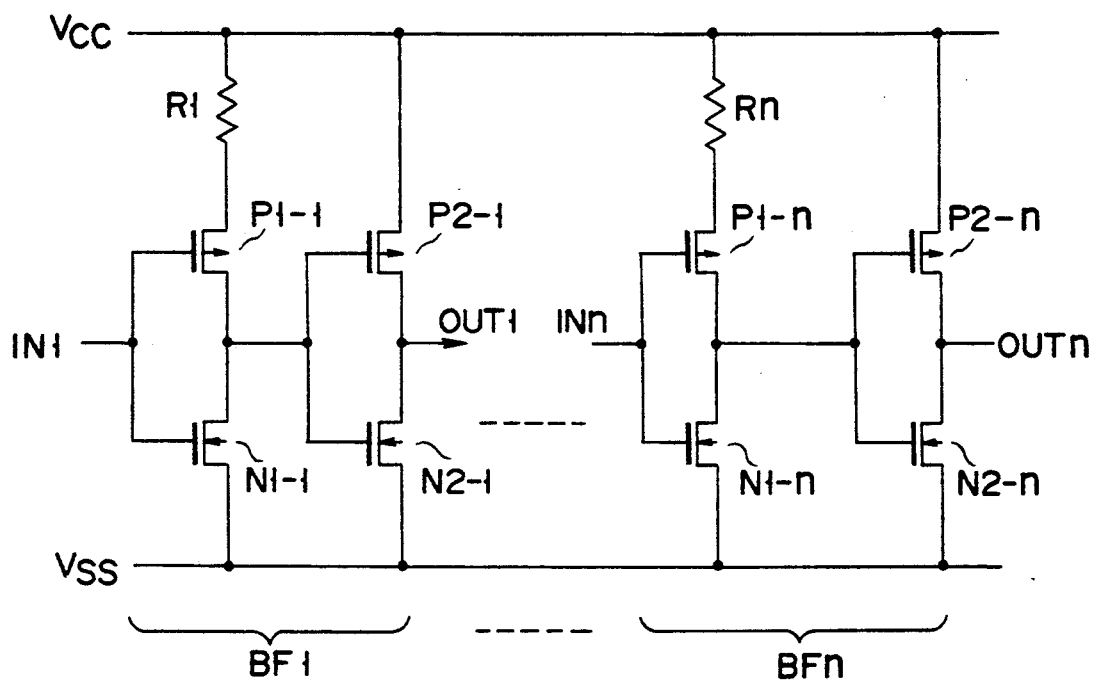
F I G. 16

BUFFER CIRCUIT HAVING A VOLTAGE DROP MEANS FOR THE PURPOSE OF REDUCING PEAK CURRENT AND THROUGH-CURRENT

This application is a continuation of application Ser. No. 07/540,334, filed Jun. 19, 1990, now abandoned.

BACKGROUND OF THE INVENTION

1. Field of the Invention

The present invention relates to a semiconductor integrated circuit and, more particularly, to an input buffer circuit and an output buffer circuit.

2. Description of the Related Art

As illustrated in FIGS. 5 and 6, an input buffer circuit of a conventional semiconductor integrated circuit such as a CMOS (complementary metal-oxide semiconductor) integrated circuit of a complementary insulation gate type comprises pre-buffer PB and main buffer MB each having a CMOS structure. The structure of the pre-buffer varies depending on whether an input signal is at a CMOS level or a TTL (transistor transistor logic) level. Pre-buffer PB of the input buffer circuit shown in FIG. 5 is used to receive an input signal of CMOS level, and pre-buffer PB of the input buffer circuit shown in FIG. 6 is used to receive an input signal of TTL level.

In the pre-buffer PB shown in FIG. 5, the ratio (W/L) of channel width W to channel length of P-channel transistor P1 arranged at the Vcc power source side is 20/1.0, and the ratio of W to L of N-channel transistor N1 arranged at the Vss power source side is also 20/1.0.

In the pre-buffer PB shown in FIG. 6, the ratio of W to L of P-channel transistor P1 is 20/1.0, and the ratio of W to L of N-channel transistor N1 is 80/1.0.

The threshold voltage of a buffer circuit having a CMOS structure depends on the ratio of the driving force of a P-channel transistor to that of an N-channel transistor. When P- and N-channel transistors P1 and N1 of pre-buffer PB in the input buffer circuit shown in FIG. 5, have the same dimension, and the Vcc potential is 5V, the threshold voltage of the circuit is usually 2.5V.

When an input signal is at a TTL level, generally, the low voltage of the input signal is 0.8V and the high voltage is 2.0V. It is thus desirable to set the threshold voltage of a buffer circuit receiving the input signal of TTL level is approximately 1.5V. To set the threshold voltage of a buffer circuit having a CMOS structure in the vicinity of 1.5V, N-channel transistor N1 of pre-buffer PB should have a larger W to L ratio than P-channel transistor Pl, as shown in FIG. 6. For this reason, the dimension ratio of P-channel transistor P1 to N-channel transistor N1 is one to four.

FIG. 7 is a graph showing the input/output voltage transmission characteristics of pre-buffers PB of the input buffer circuits illustrated in FIGS. 5 and 6. Assume that input voltage increases from 0V to 5V. In pre-buffer PB shown in FIG. 5, an output voltage decreases from 5V to 0V when the input voltage reaches 2.5V, and the threshold voltage of the input buffer circuit is 2.5V. In pre-buffer PB shown in FIG. 6, the output voltage decreases from 5V to 0V when the input voltage reaches around 1.5V, and it turns out that the threshold voltage of the input buffer circuit changes with the ratio of the driving force of P-channel transistor P1 to that of N-channel transistor N1.

In the input buffer circuit shown in FIG. 6, when the threshold voltage of pre-buffer PB is set in the vicinity of 1.5V to receive an input signal of TTL level, a semiconductor integrated circuit having a pattern is designed by the full-custom specification (completely custom-made pattern) can be miniaturized as far as a design rule allows. However, the dimension of a conventional semiconductor integrated circuit such as a gate array in which the sizes of transistors are predetermined, inevitably becomes larger at its N-channel transistor side, and, accordingly the pattern area is greatly enlarged.

The conventional semiconductor integrated circuit has the following problems.

(a) When a desired low value (e.g., 1.5V) is required as a threshold voltage to realize an input buffer circuit applicable to receiving an input signal of TTL level, the dimension of the circuit becomes large at the N-channel transistor side, and thus the pattern area is greatly enlarged. Therefore, a large amount of peak current is caused by the switching operation of the buffer circuit, and the amount of instantaneous current per time becomes very large.

(b) When the threshold voltage has a low value such as 1.5V, it is necessary to cause the dimensions of the P- and N-channel transistors to greatly differ from each other. The balance between the rise and fall of a signal is greatly deteriorated.

(c) When an input buffer circuit applicable to receiving an input signal of TTL level is realized, in a stationary state where a voltage of 3V is input to pre-buffer PB, not only N-channel transistor N1 of prebuffer PB, but also P-channel transistor P1 is turned on because the source-to-gate voltage of P-channel transistor P1 is 2V. Therefore, a through current in the order of several hundreds of microamperes per pre-buffer flows.

(d) When a plurality of buffer circuits connected in common to a power source line is switched at the same time, and the N-channel transistor of each of the buffer circuits is very large in dimension, a large amount of peak current is caused by the switching operation of the buffer circuits, and the amount of instantaneous current per unit of time (di/dt) becomes large. For this reason, the power source line cannot be kept at a constant voltage, and the level of the output signal of each buffer circuit is very high, thereby causing great ringing which results in malfunction of the circuit. This problem will be described in detail with reference to FIGS. 8 and 9.

FIG. 8 is a schematic view showing an input buffer circuit group (or an output buffer circuit group) in a conventional large scale semiconductor integrated circuit. Usually, buffer circuits 81i (i=1, 2, ..., n) of the input buffer circuit group (or output buffer circuit group) are connected in common to the power source lines (Vcc power source lines and Vss power source lines).

FIG. 9 is a graph showing input/output characteristics in a case where n buffer circuits 81i of the input buffer circuit group (or output buffer circuit group) shown in FIG. 8 are simultaneously switched. When input signals INi of n buffer circuits 81i rise at the same time, output signals INmi of the pre-buffers of n buffer circuits 81i fall at the same time. If the N-channel transistor of each of the pre-buffers is very large, the amount of instantaneous current per unit of time (di/dt) caused by the switching operation of the buffer circuits becomes very large. Since the pre-buffers of n buffer circuits 81i are simultaneously switched, the levels of the power source lines cannot be kept constant, and thus great ringing occurs in output signal INmi of each prebuffer at a ground potential level.

Furthermore, great ringing occurs in output signal OUTi of each of the main buffers receiving output signal INmi, at a power source potential level. If the amplitude of the ringing of output signal INmi or OUTi exceeds 2.5V, the circuit will malfunction. Since n buffer circuits 81i are simultaneously switched, noise is generated in the power source lines, and any other circuits having common power source lines will also malfunction. Recently, a data length used in a system such as a microcomputer has been changed from 8 bits to 16 bits and then from 16 bits to 32 bits, and the buffer circuits of an input buffer circuit group or an output buffer circuit group of a semiconductor integrated circuit used in such a system tends to increase in number. The operation speed of the system becomes high, and, if the amplitude of the ringing of an output signal of the buffer circuit is large, as described above, it is almost impossible to detect whether data is "1" or "0".

SUMMARY OF THE INVENTION

It is accordingly an object of the present invention to provide a buffer circuit in which a peak current caused by the switching operation of the buffer circuit and an instantaneous current per unit of time are decreased to prevent malfunctioning, the dimension ratio of a P-channel transistor to an N-channel transistor is lowered, the balance of the rise time and the fall time of a signal is properly adjusted in a stationary state, and a through current is reduced in the stationary state.

To attain the above object, a buffer circuit according to the present invention comprises: a first power terminal; a second power terminal; a complementary first FET pair arranged between the first and second power source terminals to receive an external signal; a complementary second FET pair which is arranged between the first and second power source terminals and whose input terminal is connected to an output terminal of the first FET pair; and voltage drop means formed between the first power source terminal and the first FET pair.

The following effects can be obtained from the buffer circuit having the foregoing configuration. The operating voltage of the buffer circuit is lower than the voltage applied from the first power source terminal by the voltage dropped by the voltage drop means. The current flowing through the N-channel transistor is thus reduced, and the peak current caused by the switching operation of the buffer circuit and the instantaneous current per unit of time (di/dt) are also reduced. It is therefore possible to prevent noise from occurring in a power source line and prevent the buffer circuit from malfunctioning.

In the conventional semiconductor integrated circuit, the threshold value of the buffer circuit is set by the dimension ratio of the P-channel transistor to the N-channel transistor in order to input a signal at a TTL level, which causes a problem because the N-channel transistor is enlarged and thus the pattern area is increased. According to the present invention, a proper threshold value of the buffer circuit can be set by lowering the operating voltage of the buffer circuit. The dimension of the N-channel transistor need not be greater than that of the P-channel transistor and the dimension ratio of the N-channel transistor to the P-channel transistor can be lowered.

The current of the N-channel transistor is decreased by lowering the dimension ratio, and the peak current caused by the switching operation of the buffer circuit and the instantaneous current per unit of time (di/dt) are also decreased, resulting in prevention of malfunction of the buffer circuit.

When the dimension ratio of the P-channel transistor to the N-channel transistor is around 1, the rise time and the fall time of a signal are nearly balanced.

To realize an input buffer circuit which receives an input signal of TTL level, the source-to-gate voltage of the P-channel transistor of a pre-buffer circuit decreases in a stationary state where the pre-buffer circuit is supplied with an input voltage of 3V. The through current per pre-buffer can thus be decreased in the order of several microamperes. In the stationary state, therefore, the through current can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram schematically showing an input buffer circuit group having a plurality of input buffer circuits as shown in FIG. 2;

FIG. 4 is a graph showing input/output characteristics of the input buffer circuit group shown in FIG. 3 in which n buffer circuits are switched at the same time;

FIGS. 5 and 6 are circuit diagrams showing input buffer circuits of a conventional semiconductor integrated circuit;

FIG. 7 is a graph showing input/output voltage transmission characteristics of the input buffer circuits shown in FIGS. 5 and 6;

FIGS. 12-16 are circuit diagrams showing input buffer circuits according to other embodiments of the present invention.

DETAILED DESCRIPTION OF THE PREFERRED EMBODIMENTS

Embodiments of the present invention will be described in detail with reference to the accompanying drawings.

Figure 1:
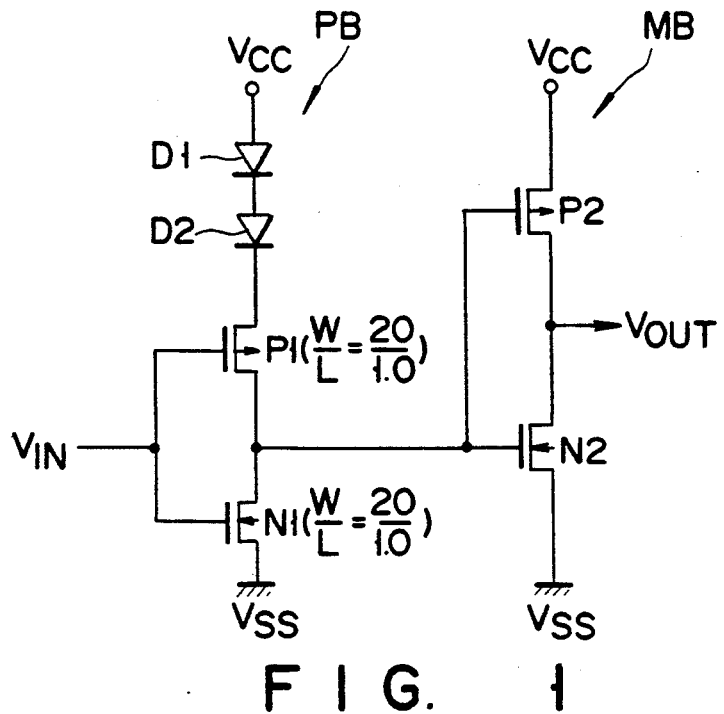
FIG. 1 is a circuit diagram showing an input buffer circuit of a semiconductor integrated circuit according to an embodiment of the present invention.

FIG. 1 is a circuit diagram showing an input buffer circuit of a CMOS integrated circuit which is used to receive an input signal of TTL level. The input buffer circuit shown in FIG. 1 is the same as the conventional input buffer circuit shown in FIG. 5, except that two diodes D1 and D2 are connected in series in the forward direction between a source of P-channel transistor P1 of pre-buffer PB and a Vcc power source line thereof. The same elements of the circuits shown in FIGS. 1 and 5 are denoted by the same reference numerals. In pre-buffer PB of the input buffer circuit shown in FIG. 1, P-channel transistor P1, whose gate is connected to two diodes D1 and D2 between a Vcc power source terminal and a Vss power source terminal, is connected to N channel transistor N1 in series. In main buffer MB of the input buffer circuit, P-channel transistor P2 and N-channel transistor N2, whose gates are connected to an output terminal of pre-buffer PB, are connected in series between the Vcc and Vss power source terminals.

In the input buffer circuit having the above arrangement, the operating voltage of pre-buffer PB is lower than power source voltage Vcc applied from outside to the CMOS integrated circuit by the voltage drop of the two diodes D1 and D2 (if the voltage drop of one diode is 0.9V, the voltage drop of the two diodes is 1.8V) If the Vcc potential is 5V, the operating voltage of pre-buffer PB is about 3.2V, and thus the pre-buffer is equivalent to a CMOS inverter whose power source voltage is about 3.2V. Since the operating voltage is low, the current of N-channel transistor N1 is reduced, and the dimension (W/L=20/1.0) of N-channel transistor N1 of pre-buffer PB is only one-fourth of the dimension (W/L=80/1.0) of N-channel transistor N1 of the conventional pre-buffer PB. The peak current caused by the switching operation of pre-buffer PB and the instantaneous current per unit of time (di/dt) are decreased to one-fourth of those currents in the conventional pre-buffer PB shown in FIG. 6, and noise occurring on the power source line is suppressed, thereby preventing the circuit from malfunctioning.

Since the dimensions of P-channel transistor P1 and N-channel transistor N1 of pre-buffer PB are the same, the threshold voltage of pre-buffer PB depends on the operating voltage of pre-buffer PB and it is about 1.6V which is a half of the operating voltage. When an input signal of TTL level is at a low level of 0.8V or less, P-channel transistor P1 of pre-buffer PB is turned on and N-channel transistor N1 is turned off, and an output signal of pre-buffer PB becomes high in level. P-channel transistor P2 of main buffer MB is turned off and N-channel transistor N2 is turned on, and an output signal of pre-buffer PB becomes low in level. When an input signal of a TTL level is at a high level of 2.0V or more, P-channel transistor P2 of pre-buffer PB is turned off and N-channel transistor N2 is turned on, and an output signal of pre-buffer PB becomes low in level. P-channel transistor P2 of main buffer MB is thus turned on and N-channel transistor N2 is turned off, and an output signal of pre-buffer PB becomes high in level.

Since the dimensions of P- and N-channel transistors P1 and N1 of pre-buffer PB are the same, the rise time and the fall time of a signal are nearly balanced.

N-channel transistor N1 of pre-buffer PB is turned on in a stationary state when an input voltage of 3V is applied to pre-buffer PB. Since the source-to-gate voltage of P-channel transistor P1 is only 0.2V, the amount of the current of P-channel transistor P1 is small, and the through current can be reduced in the order of several microamperes per pre-buffer.

Figure 2:
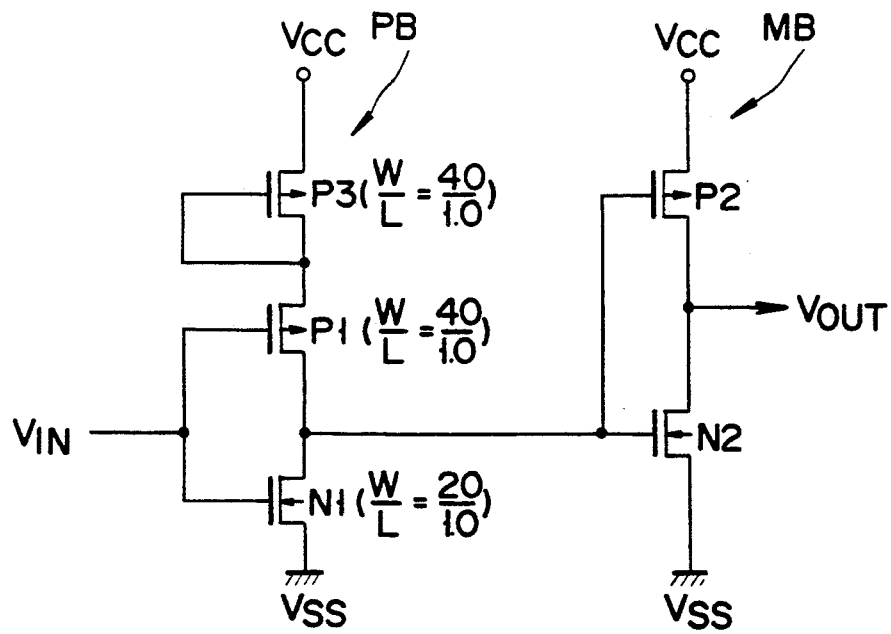
FIG. 2 is a circuit diagram showing an input buffer circuit according to another embodiment of the present invention.
Figure 8:
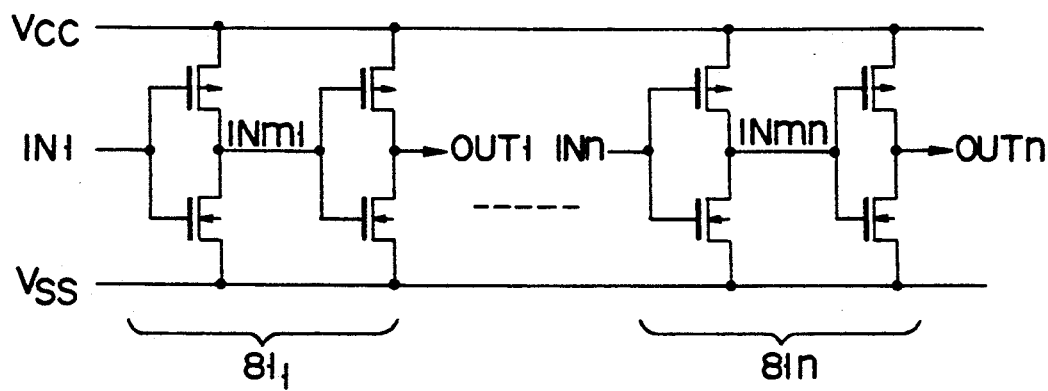
FIG. 8 is a circuit diagram schematically showing an input buffer circuit group (or output buffer circuit group) of a conventional large scale semiconductor integrated circuit.
Figure 9:
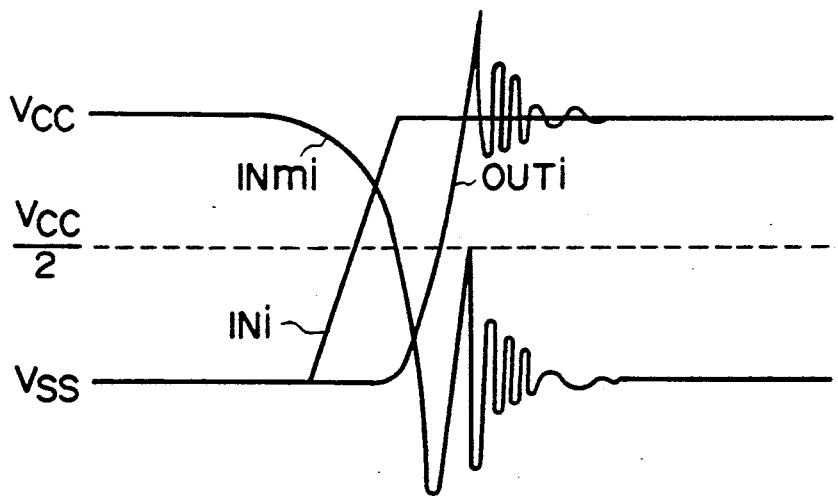
FIG. 9 is a graph showing input/output characteristics of the input buffer circuit group (or output buffer circuit group) in which n buffer circuits are switched at the same time.

FIG. 2 is a circuit diagram showing an input buffer circuit according to another embodiment of the present invention. The input buffer circuit shown in FIG. 2 differs from that in FIG. 1 in the following two points: (a) The ratio of W to L of P-channel transistor P1 of pre-buffer PB is 40 to 1.0; (b) The source and drain of P-channel transistor P3 whose gate and drain are short-circuited between the source and the Vcc power source line of P-channel transistor P1 of pre-buffer PB and in which the ratio of W to L (W/L) is, for example, 40 to 1.0. Since the circuit shown in FIG. 2 is the same as that in FIG. 1 except for the above two points, the same elements of the circuits shown in FIGS. 1 and 2 are represented by the same reference numerals.

The pre-buffer PB shown in FIG. 2 performs substantially the same operation as the pre-buffer shown in FIG. 1 and therefore substantially the same effects can be obtained. If the source-to-drain voltage of P-channel transistor P3 whose gate and drain are shortcircuited and in which the ratio of W to L (W/L) is 40 to 1.0, is 0.9V, the operating voltage of pre-buffer PB is about 4.1V when the Vcc potential is 5V, and prebuffer PB is rendered equivalent to the CMOS inverter when the power source voltage is about 4.1V. Unlike diodes D1 and D2, P-channel transistor P3, whose gate and drain are short-circuited, serves as a resistor element to control a current. The threshold voltage of prebuffer PB depends on the operating voltage and on the dimension ratio of P-channel transistor P1 to N-channel transistor N1 and it is around 1.5V. The input buffer circuit shown in FIG. 2 is also used to receive a signal of TTL level. Even though the driving force of P-channel transistor P1 of pre-buffer PB is low, the dimension thereof (W/L=40/1.0) can be small unless there occurs any trouble such as a decrease in operating speed.

When a desired low value (for example, 1.5V) is obtained as a threshold voltage of an input buffer circuit applicable to receiving a signal of TTL level, a required dimension of N-channel transistor N1 can be made smaller than that of the N-channel transistor of the conventional buffer circuit shown in FIG. 6. This miniaturization of N-channel transistor N1 reduces the current of N-channel transistor N1, the peak current caused by the switching operation of the buffer circuit, and the instantaneous current per unit of time (di/dt), thereby preventing noise from occurring in the power source line, and so preventing the circuit from malfunctioning.

In the stationary state, when an input voltage of 3V is applied to pre-buffer PB, N-channel transistor N1 of pre-buffer PB is turned on. Since, however, the source-to-gate voltage of P-channel transistor P1 is only 1.1V, the amount of current flowing through P-channel transistor P1 is small and it can be decreased to the through current in the order of several microamperes per pre-buffer.

FIG. 3 is a circuit diagram schematically illustrating an input buffer circuit group in a large scale semiconductor integrated circuit having a plurality of input buffer circuits. The power source lines (Vcc power source line, Vss power source line) of the input buffer circuit group are usually connected in common to each of buffer circuits 31$i$ ($i=1, 2, \ldots, n$).

FIG. 4 is a graph showing input/output characteristics of the input buffer circuit group shown in FIG. 3 in which n buffer circuits are switched at the same time. In FIG. 4, when input signals IN$i$ of n buffer circuits 31$i$ rise at the same time, output signals INm$i$ of the pre-buffers of n buffer circuits 31$i$ fall at the same time. Since the N-channel transistor of each of the pre-buffers is small in dimension, the peak current caused by the switching operation and the instantaneous current per unit of time (di/dt) are small, and the amplitude of ringing of output signal INm of each pre buffer or output signal OUT$i$ of each main buffer is narrowed. Noise is thus prevented in the power source line and, other circuits having in common power source lines are prevented from malfunctioning.

The above embodiments show the input buffer circuit used to receive a signal of TTL level. Even if the present invention is applied to an input buffer circuit used to receive a signal of CMOS level, the same effects can be obtained.

The above embodiments show the input buffer circuit. If an output buffer circuit is connected to a MOS transistor with diodes or whose gate and drain are short-circuited, as in the above embodiments, the same effects can be obtained.

The above embodiments also show the buffer circuit comprising a pre-buffer circuit and a main buffer each having a CMOS structure. If an input buffer circuit or an output buffer circuit having another structure is connected to a MOS transistor with diodes or whose gate and drain are short-circuited, as in the above embodiments, the same effects can be obtained.

Figure 10:
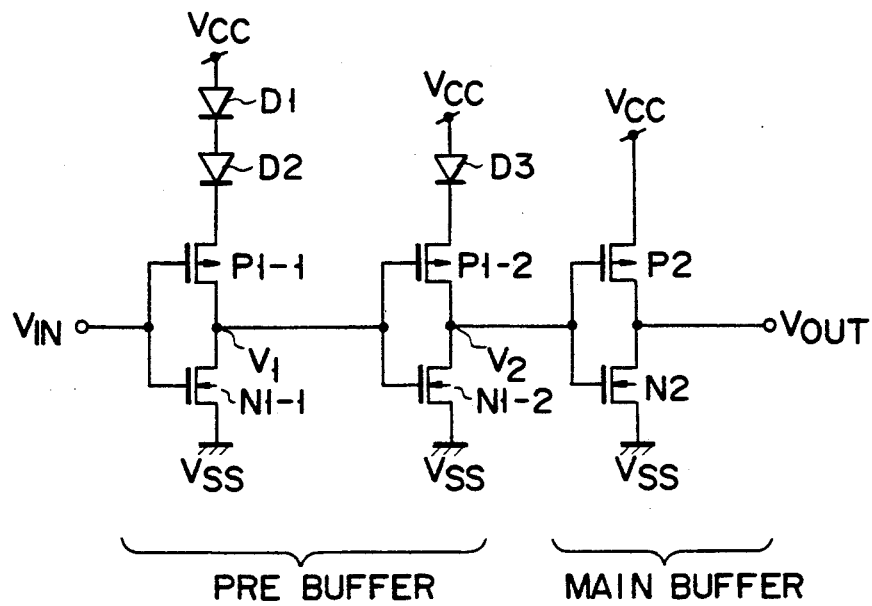
FIG. 10 is a circuit diagram showing an input buffer circuit according to still another embodiment of the present invention.
Figure 11:
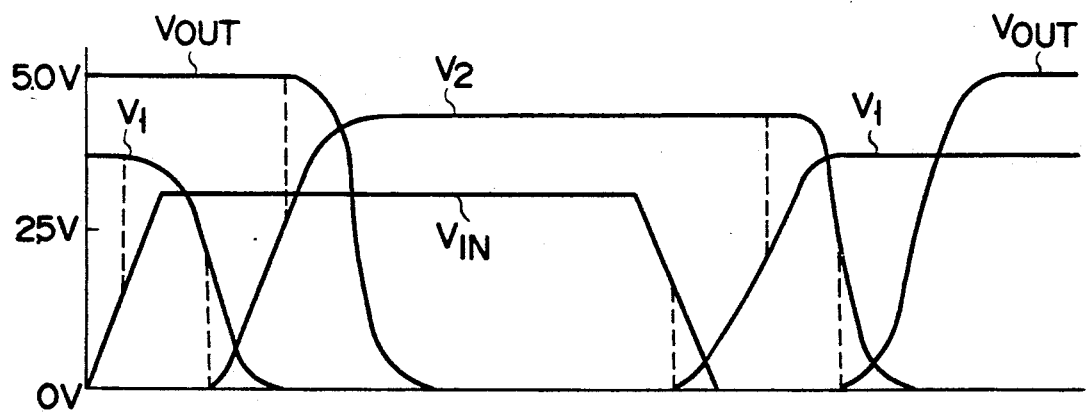
FIG. 11 is a graph showing the respective potentials in the input buffer circuit shown in FIG. 10.

FIG. 10 is a circuit diagram showing a buffer circuit according to another embodiment of the present invention, and FIG. 11 is a graph showing the respective potentials in the input buffer circuit shown in FIG. 10. In this buffer circuit, a pre-buffer circuit comprises an FET pair of a first pre-buffer circuit having transistors N1-1 and P1-1 and a second pre-buffer circuit having transistors N1-2 and P1-2. The second pre-buffer circuit has only one diode D3. The main buffer circuit of the buffer circuit shown in FIG. 10 has the same arrangement as that of the main buffer circuit shown in FIG. 1.

As is apparent from the graph of FIG. 11, the arrangement of the buffer circuit shown in FIG. 10 enables the first pre-buffer circuit to be driven at low driving voltage $V_{IN}$ to output signal $V_1$ at a range between 0 and 3.2V, without causing any feedthrough current to flow. A second pre-buffer circuit is driven by output signal $V_1$. When the second pre-buffer circuit is driven by output signal $V_1$ at 0V, transistor P1-2 is turned on when $V_{GS}$ is 4.1V and transistor N1-2 is turned off when $V_{GS}$ is 0V to output signal $V_2$ at a high level of 4.1V. When the second pre-buffer circuit is driven by output signal $V_1$ at 3.2V, transistor P1-2 is turned off when $V_{GS}$ is 0.9V and transistor N1-2 is turned on when $V_{GS}$ is 3.2V. It is thus possible to output signal $V_2$, at high level, without any feedthrough current flowing. Similarly, the main buffer is driven by output signal $V_2$. When output signal $V_2$ is at 0V in level, transistor N2 is turned off when $V_{GS}$ is 0V and transistor P2 is turned on when $V_{GS}$ is 5V to output a signal at a high level. When output signal $V_2$ is at 4.1V, transistor N2 is turned on when $V_{GS}$ is 4.1V and transistor P2 is turned off when $V_{GS}$ is 0.9V. It is thus possible to output a signal at a low level without any feedthrough current flowing. In these circuits, a stable operation can thus be performed without any feedthrough current flowing.

FIGS. 12-16 are circuit diagrams showing input buffer circuits according to other embodiments of the present invention.

The buffer circuit shown in FIG. 12 comprises FETs P3 and P4 whose gate and drain are connected between a transistor pair of the main buffer and a power source terminal. With this arrangement, the source voltage of main buffer P2 becomes 4.1V. For this reason, like the buffer circuit shown in FIG. 11, the buffer circuit shown in FIG. 12 can be operated, without any feedthrough current flowing, even when the output of the pre-buffer is at 3.8V. Since the amount of current can be increased by arranging transistors in parallel, the buffer circuit can be operated at high speed.

The buffer circuit shown in FIG. 13 comprises diodes D1-1 and D1-2 which are connected in parallel between a transistor pair and a power source terminal. The parallel connection of the diodes allows a large amount of current to flow through the diodes, thereby performing the operation of the circuit at high speed.

The buffer circuit shown in FIG. 14 comprises or resistor R in place of a diode. In this buffer circuit, the same effects as in the embodiment shown in FIG. 1 can be obtained.

The buffer circuit shown in FIG. 15 comprises diode D1. Though the number of diodes is only one, the same effects can be achieved, and the present invention can be put into practice with a simple arrangement having a small number of parts.

The buffer circuit shown in FIG. 16 comprises the buffer circuits of the above embodiments shown in FIGS. 12-15 which are connected in parallel. First buffer circuit BF1 comprises two pairs of transistors P1-1 and N1-1; P2-1 and N2-1, and resistor R1 connected between transistor pair P1-1 and N1-1 and a a power source terminal. The same effects can thus be obtained. In FIG. 16, BFn represents an n-th buffer circuit comprising two transistor pairs P1-1 and N1-1, P2-1 and N2-1, and resistor R1 between transistor pair P1-1 and N1-1 and a power source terminal. In this buffer circuit, the same effects can be obtained. Resistors R1 to Rn can be replaced by other circuit components such as diodes and FETs having resistor components. All the buffer circuits disclosed in the above embodiments can be used to create a plurality of parallel buffer circuits, as illustrated in FIG. 16.

As described above, according to the present invention, even in a semiconductor integrate circuit such as a gate array wherein the size of a transistor is predetermined, the peak current caused by the switching operation of an input buffer circuit or an output buffer circuit and the instantaneous current per unit of time (di/dt) can be prevented from flowing, thereby to prevent the buffer circuit from malfunctioning. The dimension ratio of the P-channel transistor of the buffer circuit to the N-channel transistor can be miniaturized. When the dimension ratio is around 1, the rise time and the fall time of a signal are nearly balanced, and the amount of through current in the stationary state can be greatly decreased.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A buffer circuit comprising:
   a first power source terminal;
   a second power source terminal;
   a first complementary FET pair arranged between said first and second power source terminals to receive an external signal, said first complementary FET pair having an output terminal;
   a second complementary FET pair arranged between said first and second power source terminals, said second complementary FET pair having an input terminal connected to said output terminal of said first FET pair, and said second complementary FET having an output terminal;
   a third complementary FET pair arranged between said first and second power source terminals, said third complementary FET pair having an input terminal connected to said output terminal of said second complementary FET pair;
   first means for dropping a voltage of said first power source terminal connected between said first power source terminal and said first FET pair; and
   second means for dropping a voltage of said first power source terminal connected between said first power source terminal and said second FET pair;
   wherein said first means for dropping a voltage drops a voltage further than said second means for dropping a voltage.

2. A buffer circuit according to claim 1, wherein said first FET pair includes two FETs having substantially the same dimension.

3. A buffer circuit according to claim 1, wherein one of said first and second voltage drop means includes a diode.

4. A buffer circuit according to claim 1, wherein one of said first and second voltage drop means includes two or more diodes connected in series to each other.

5. A buffer circuit according to claim 1, wherein one of said first and second voltage drop means includes two or more diodes connected in parallel with each other.

6. A buffer circuit according to claim 1, wherein one of said first and second voltage drop means includes an FET having a gate and source, said gate and source being short-circuited.

7. A buffer circuit according to claim 1, wherein one of said first and second voltage drop means includes at least two FETs which are connected in series to each other, each of said FETs having a gate and a source, said gate and source of each FET being short-circuited.

8. A buffer circuit according to claim 1, wherein one of said first and second voltage drop means includes two or more FETs which are connected in parallel with each other, each of said FETs having a gate and a source, said gate and source of each FET being short-circuited.

9. A buffer circuit according to claim 1, wherein one of said first and second voltage drop means includes a resistor.

10. A buffer circuit according to claim 1, further comprising:
    an FET arranged between said first power source terminal and said third complementary FET pair, said FET having a gate and a source, said gate and source being short-circuited;
    wherein said first voltage drop means includes an FET having a gate and a source, said gate and source being short-circuited.

11. A buffer circuit according to claim 1, further comprising:
    a resistor connected between said first power source terminal and said third complementary FET pair;
    wherein said first voltage drop means includes one or more resistors.

12. A buffer circuit according to claim 3, wherein said third complementary FET pair has an output, and said buffer circuit further comprises an additional plurality of cascaded complementary FET pairs, said additional plurality of complementary FET pairs having an input connected to said output of said third complementary FET pair.

13. A buffer circuit according to claim 4, wherein said third complementary FET pair has an output, and said buffer circuit further comprises an additional plurality of cascaded complementary FET pairs, said additional plurality of complementary FET pairs having an input connected to said output of said third complementary FET pair.

14. A buffer circuit according to claim 6, wherein said third complementary FET pair has an output, and said buffer circuit further comprises an additional plurality of cascaded complementary FET pairs, said additional plurality of complementary FET pairs having an input connected to said output of said third complementary FET pair.

15. A buffer circuit according to claim 7, wherein said third complementary FET pair has an output, and said buffer circuit further comprises an additional plurality of cascaded complementary FET pairs, said additional plurality of complementary FET pairs having an input connected to said output of said third complementary FET pair.

16. A buffer circuit according to claim 9, wherein said third complementary FET pair has an output, and said buffer circuit further comprises an additional plurality of cascaded complementary FET pairs, said additional plurality of complementary FET pairs having an input connected to said output of said third complementary FET pair.

17. A buffer circuit according to claim 5, wherein said third complementary FET pair has an output, and said buffer circuit further comprises an additional plurality of cascaded complementary FET pairs, said additional plurality of complementary FET pairs having an input connected to said output of said third complementary FET pair.

18. A buffer circuit according to claim 1, wherein said second power source terminal is a circuit ground terminal.

19. A buffer circuit according to claim 1, wherein said first means for dropping a voltage drops a voltage twice as far as said second means for dropping a voltage.

20. A buffer circuit comprising:
    a power source terminal;
    a circuit ground terminal;
    a first complementary FET pair arranged between said power source terminal and said circuit ground terminal to receive an external signal, said first complementary FET pair including an P type FET connected to said power source terminal and an N type FET connected to said circuit ground terminals, and said first complementary FET pair having an output terminal;

a second complementary FET pair arranged between said power source terminal and said circuit ground terminal, said second complementary FET pair having an input terminal connected to said output terminal of said first FET pair; and an P type FET having a gate, a source, and a drain, said source of said P type FET being connected to said power source terminal, said drain of said P type FET being connected to said P type FET of said first FET pair and said gate of said P type FET being connected to said drain of said P type FET, wherein said P type FET drops a voltage of said power source terminal;

wherein the ratio of the ratios of channel width to channel length of said P type FET and said N type FET of said first complementary FET pair is substantially 2:1.

* * * * *